（12） United States Patent
Yamaguchi et al.

(10) Patent No.: US 12,308,814 B2
(45) Date of Patent: May 20, 2025

(54) COMMON MODE FILTER CIRCUIT AND DRIVE DEVICE

(71) Applicants: IHI Corporation, Tokyo (JP); NATIONAL UNIVERSITY CORPORATION HOKKAIDO UNIVERSITY, Sapporo (JP)

(72) Inventors: Koji Yamaguchi, Tokyo (JP); Satoshi Ogasawara, Sapporo (JP); Shunsuke Ohara, Sapporo (JP)

(*) Notice: Subject to any disclaimer, the term of this patent is extended or adjusted under 35 U.S.C. 154(b) by 232 days.

(21) Appl. No.: 18/326,081

(22) Filed: May 31, 2023

(65) Prior Publication Data

US 2023/0308069 A1    Sep. 28, 2023

Related U.S. Application Data

(63) Continuation of application No. PCT/JP2021/043898, filed on Nov. 30, 2021.

(30) Foreign Application Priority Data

Dec. 2, 2020   (JP) ................................. 2020-200183

(51) Int. Cl.
  *H03H 7/01*      (2006.01)
  *H01F 27/28*    (2006.01)
  (Continued)

(52) U.S. Cl.
  CPC ....... *H03H 7/0115* (2013.01); *H01F 27/2823* (2013.01); *H01F 27/29* (2013.01); *H02P 27/06* (2013.01)

(58) Field of Classification Search
  CPC ........ H03H 7/0115; H03H 7/075; H03H 7/09; H03H 7/12; H03H 7/13; H03H 7/427
  See application file for complete search history.

(56) References Cited

U.S. PATENT DOCUMENTS 6,049,475 A    4/2000 Azuma et al.
2007/0211501 A1*  9/2007 Zargari ............... H02M 5/4585
                                                363/39
(Continued)

FOREIGN PATENT DOCUMENTS

CH        715448      4/2020
EP       1160965     12/2001
  (Continued)

OTHER PUBLICATIONS

International Search Report dated Jan. 18, 2022 for PCT/JP2021/043898.
(Continued)

*Primary Examiner* — Said Bouziane
(74) *Attorney, Agent, or Firm* — SOEI PATENT & LAW FIRM

(57) ABSTRACT

A common mode filter circuit comprises a common mode transformer unit, an inverter, and a capacitor unit. Each of the first common mode transformer, the second common mode transformer, and the third common mode transformer comprises a first secondary wound wire, a second secondary wound wire, a third secondary wound wire, and a primary wound wire. A ratio of a number of turns of the primary wound wire to a number of turns of the first secondary wound wire, a ratio of a number of turns of the primary wound wire to a number of turns of the second secondary wound wire, and a ratio of a number of turns of the primary wound wire to a number of turns of the third secondary wound wire are each 3:1 in each of the first common mode transformer, the second common mode transformer, and the third common mode transformer.

20 Claims, 3 Drawing Sheets

(51) Int. Cl.
*H01F 27/29* (2006.01)
*H02P 27/06* (2006.01)

(56) References Cited

U.S. PATENT DOCUMENTS

| | | |
|---|---|---|
| 2021/0384815 A1 | 12/2021 | Kolar et al. |
| 2023/0118022 A1 | 4/2023 | Kolar et al. |

FOREIGN PATENT DOCUMENTS

| | | |
|---|---|---|
| EP | 2966661 | 1/2016 |
| JP | H11-299264 | 10/1999 |
| JP | 2001-231268 | 8/2001 |
| JP | 2001-268922 | 9/2001 |
| JP | 2005-160263 | 6/2005 |
| JP | 2010-041908 | 2/2010 |
| JP | 2010-193546 | 9/2010 |
| JP | 2011-228394 | 11/2011 |
| JP | 2019-115223 | 7/2019 |
| WO | 98/042068 | 9/1998 |

OTHER PUBLICATIONS

Masashi Ogawa et al., "Development of a High-Frequency Space Vector Pulse Width Modulated Inverter with an Active Common-Noise Canceler", 2014 IEEE 36th International Telecommunications Energy Conference (INTELEC), IEEE, Sep. 28, 2014, p. 1-p. 6.

Extended Search Report in corresponding European Application No. 21900600.4 dated Aug. 22, 2024.

International Preliminary Report on Patentability with Written Opinion dated Jun. 15, 2023 for PCT/JP2021/043898.

\* cited by examiner

COMMON MODE FILTER CIRCUIT AND DRIVE DEVICE

CROSS-REFERENCE TO RELATED APPLICATIONS

This application is a continuation application of PCT Application No. PCT/JP2021/043898, filed on Nov. 30, 2021, which claims the benefit of priority from Japanese Patent Application No. 2020-200183, filed on Dec. 2, 2020, the entire contents of which are incorporated herein by reference.

BACKGROUND

Techniques to reduce noise in an AC electric motor supplied with AC from an inverter have been proposed. A method of installing a zero-phase reactor between the inverter and the AC electric motor is widely used as a countermeasure against noise on an output side of the inverter. Installation of a zero-phase reactor is effective to some extent in reducing a common mode electric current. Installation of a zero-phase reactor is a simple method that does not require a large reactor and is widely used. In Japanese Unexamined Patent Publication No. 2019-115223, for example, a circuit in which a three-phase electric wire that connects an inverter and an AC electric motor to each other is passed through the inside of an annular magnetic body and a capacitor is connected to a separate electric wire wound through the inside and the outside of the annular magnetic body is disclosed.

Incidentally, the technique described above is effective to some extent in reducing the common mode electric current, but is not sufficiently effective in reducing a common mode voltage, which causes failure of bearings of the AC electric motor. Therefore, the technique described above is limited in an effect of a countermeasure against noise.

Accordingly, the present disclosure describes providing a common mode filter circuit that can reduce a common mode voltage.

SUMMARY

An example common mode filter circuit which is connected between an inverter including a pair of input terminals connected to a power source and three output terminals for outputting a three-phase AC, and a three-phase AC electric motor supplied with the three-phase AC from the output terminals of the inverter, the common mode filter circuit including: three common mode transformers canceling out common mode voltages of the three-phase AC; and three pairs of capacitors each connected to the common mode transformers and the input terminals of the inverter, wherein one end of a primary wound wire of each of the three common mode transformers is connected to one of the three output terminals of the inverter, wherein the other end of the primary wound wire of each of the three common mode transformers is connected to one end of one of each pair of the capacitors in the three pairs of capacitors of which the other end is connected to one of the pair of input terminals of the inverter and one end of the other of each pair of the capacitors in the three pairs of capacitors of which the other end is connected to the other of the pair of input terminals of the inverter, wherein three-phase secondary wound wires of the three common mode transformers are connected to each other in series, wherein one end of each of the three-phase secondary wound wires of the three common mode transformers connected to each other in series is connected to one of the three output terminals of the inverter, wherein the other end of each of the three-phase secondary wound wires of the three common mode transformers connected to each other in series is connected to the three-phase AC electric motor, and wherein a ratio of the number of turns of the primary wound wire to the number of turns of the secondary wound wire of each of the three common mode transformers is 3:1.

DETAILED DESCRIPTION

Figure 1:
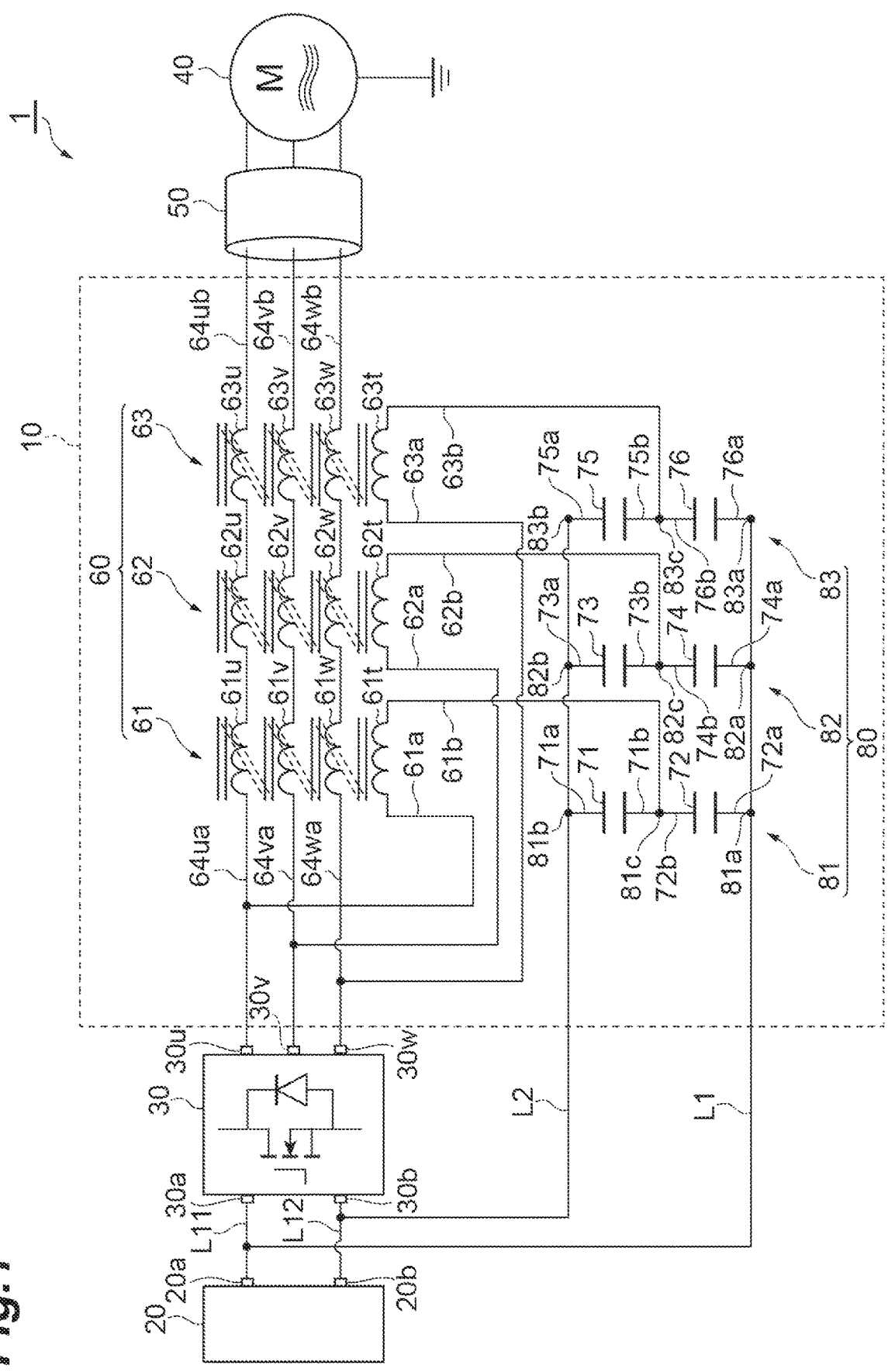
FIG. 1 is a diagram showing an example common mode filter circuit.

An example common mode filter circuit which is connected between an inverter include a pair of input terminals connected to a power source and three output terminals for outputting a three-phase AC, and a three-phase AC electric motor supplied with the three-phase AC from the output terminals of the inverter, the common mode filter circuit including: three common mode transformers canceling out common mode voltages of the three-phase AC; and three pairs of capacitors each connected to the common mode transformers and the input terminals of the inverter, wherein one end of a primary wound wire of each of the three common mode transformers is connected to one of the three output terminals of the inverter, wherein the other end of the primary wound wire of each of the three common mode transformers is connected to one end of one of each pair of the capacitors in the three pairs of capacitors of which the other end is connected to one of the pair of input terminals of the inverter and one end of the other of each pair of the capacitors in the three pairs of capacitors of which the other end is connected to the other of the pair of input terminals of the inverter, wherein three-phase secondary wound wires of the three common mode transformers are connected to each other in series, wherein one end of each of the three-phase secondary wound wires of the three common mode transformers connected to each other in series is connected to one of the three output terminals of the inverter, wherein the other end of each of the three-phase secondary wound wires of the three common mode transformers connected to each other in series is connected to the three-phase AC electric motor, and wherein a ratio of the number of turns of the primary wound wire to the number of turns of the secondary wound wire of each of the three common mode transformers is 3:1.

In some examples, a common mode filter circuit which is connected between an inverter having a pair of input terminals connected to a power source and three output terminals for outputting a three-phase AC, and a three-phase AC electric motor supplied with the three-phase AC from the output terminals of the inverter is provided. The common mode filter circuit includes three common mode transformers canceling out common mode voltages of the three-phase AC and three pairs of capacitors each connected to the common mode transformers and the input terminals of the inverter.

One end of a primary wound wire of each of the three common mode transformers is connected to one of the three output terminals of the inverter. The other end of the primary wound wire of each of the three common mode transformers is connected to one end of one of each pair of the capacitors in the three pairs of capacitors of which the other end is connected to one of the pair of input terminals of the inverter and one end of the other of each pair of the capacitors in the three pairs of capacitors of which the other end is connected to the other of the pair of input terminals of the inverter. As a result, the common mode voltages are detected by the primary wound wires of the three common mode transformers.

Three-phase secondary wound wires of the three common mode transformers are connected to each other in series. One end of each of the three-phase secondary wound wires of the three common mode transformers connected to each other in series is connected to one of the three output terminals of the inverter. The other end of each of the three-phase secondary wound wires of the three common mode transformers connected to each other in series is connected to the three-phase AC electric motor. In the three common mode transformers, the primary wound wires are for each phase, the secondary wound wires are three phases together, and the ratio of the number of turns of each of the primary wound wires to the number of turns of each of the secondary wound wires is 3:1, and thus the common mode voltages are properly canceled out from the voltage of each phase. As a result, the common mode voltages can be reduced.

In this case, the number of turns of the primary wound wire of each of the three common mode transformers may be 3, and the number of turns of the secondary wound wire of each of the three common mode transformers may be 1.

In some examples, the number of turns of the primary wound wire of each of the three common mode transformers may be 3, and the number of turns of the secondary wound wire of each of the three common mode transformers may be 1. Therefore, it is possible to make the number of turns of the thick secondary wound wire minimum. Since the electric current flowing through the primary wound wires is small, the primary wound wires can be thin, and the number of turns of each of the primary wound wires is 3. For this reason, the primary wound wires occupy only a small space. As a result, it is possible to significantly reduce the size of each of the common mode transformers.

In this case, the primary wound wire of each of the three common mode transformers may be wound three times by passing through the inside and the outside of an annular core of the common mode transformer, and the secondary wound wire of each of the three common mode transformers may be wound one time by passing through the inside of the annular core of each of the three common mode transformers only one time.

In some examples, since the electric current flowing through the primary wound wires is small, the primary wound wires can be thin, and each of the primary wound wires is wound three times by passing through the inside and the outside of the annular core of each of the common mode transformers. For this reason, the primary wound wires occupy only a small space. In addition, since each of the secondary wound wires of the three common mode transformers is wound one time by passing through the inside of the annular core of each of the three common mode transformers only one time, it is easy to increase the space factor of each of the secondary wound wires, and it is easy to reduce the size of each of the three common mode transformers. As a result, it is possible to significantly reduce the size of each of the common mode transformers.

Hereinafter, with reference to the drawings, the same elements or similar elements having the same function are denoted by the same reference numerals, and redundant description will be omitted. As shown in FIG. 1, an example common mode filter circuit 10 is connected between an inverter 30 having a pair of input terminals 30*a* and 30*b* connected to a power source 20 and three output terminals 30*u*, 30*v*, and 30*w* for outputting a three-phase AC, and a three-phase AC electric motor 40 supplied with the three-phase AC from the output terminals 30*u*, 30*v*, and 30*w* of the inverter 30 via a motor cable 50. A drive device 1 includes the common mode filter circuit 10, the inverter 30 and the three-phase AC electric motor 40.

The power source 20 is a DC power source such as a battery and a converter. The inverter 30 is, for example, a voltage type PWM inverter. The inverter 30 converts a DC voltage supplied from the power source 20 via the input terminals 30*a* and 30*b* into a three-phase AC voltage by a switching operation of an electric power semiconductor element (IGBT, SiC, or the like) and outputs the three-phase AC voltage from the output terminals 30*u*, 30*v*, and 30*w*. The AC voltage converted by the inverter 30 is supplied to the three-phase AC electric motor 40 via the common mode filter circuit 10 and the motor cable 50. A frame of the three-phase AC electric motor 40 is connected to a ground voltage via a ground wire.

The common mode filter circuit 10 includes a common mode transformer unit 60 including three common mode transformers 61, 62, and 63 and a capacitor unit 80 including three capacitor circuits 81, 82, and 83. The three common mode transformers 61, 62, and 63 are electrically connected between the output terminals 30*u*, 30*v*, and 30*w* of the inverter 30 and the three-phase AC electric motor 40. The common mode transformers 61, 62, and 63 are configured to cancel out common mode voltages of the three-phase AC output from the output terminals 30*u*, 30*v*, and 30*w*. The capacitor circuits 81, 82, and 83 are electrically connected between the common mode transformers 61, 62, and 63 and the input terminals 30*a* and 30*b* of the inverter 30.

The capacitor circuit 81 includes a connection point 81*a*, a connection point 81*b*, a middle point 81*c*, and a pair of capacitors 71 and 72. The middle point 81*c* is a connection point disposed between the connection point 81*a* and the connection point 81*b*. The capacitors 71 and 72 are connected to each other in series between the connection point 81*a* and the connection point 81*b*. The capacitor 71 is connected between the connection point 81*b* and the middle point 81*c*. A first end 71*a* (one end) of the capacitor 71 is connected to the connection point 81*b*, and a second end 71*b* (other end) of the capacitor 71 is connected to the middle point 81*c*. The capacitor 72 is connected between the middle point 81*c* and the connection point 81*a*. A first end 72*a* (one end) of the capacitor 72 is connected to the connection point 81*a*, and a second end 72*b* (other end) of the capacitor 72 is connected to the middle point 81*c*.

The capacitor circuit 82 includes a connection point 82*a*, a connection point 82*b*, a middle point 82*c*, and a pair of capacitors 73 and 74. The middle point 82*c* is a connection point disposed between the connection point 82*a* and the connection point 82*b*. The capacitors 73 and 74 are connected to each other in series between the connection point 82*a* and the connection point 82*b*. The capacitor 73 is connected between the connection point 82*b* and the middle point 82*c*. A first end 73*a* (one end) of the capacitor 73 is connected to the connection point 82*b*, and a second end 73*b* (other end) of the capacitor 73 is connected to the middle point 82*c*. The capacitor 74 is connected between the middle point 82*c* and the connection point 82*a*. A first end 74*a* (one end) of the capacitor 74 is connected to the connection point 82*a*, and a second end 74*b* (other end) of the capacitor 74 is connected to the middle point 82*c*.

The capacitor circuit 83 includes a connection point 83*a*, a connection point 83*b*, a middle point 83*c*, and a pair of capacitors 75 and 76. The middle point 83*c* is a connection point disposed between the connection point 83*a* and the connection point 83*b*. The capacitors 75 and 76 are connected to each other in series between the connection point 83*a* and the connection point 83*b*. The capacitor 75 is connected between the connection point 83*b* and the middle point 83*c*. A first end 75*a* (one end) of the capacitor 75 is connected to the connection point 83*b*, and a second end 75*b* (other end) of the capacitor 75 is connected to the middle point 83*c*. The capacitor 76 is connected between the middle point 83*c* and the connection point 83*a*. A first end 76*a* (one end) of the capacitor 76 is connected to the connection point 83*a*, and a second end 76*b* (other end) of the capacitor 76 is connected to the middle point 83*c*.

For example, the connection point 81*a* of the capacitor circuit 81, the connection point 82*a* of the capacitor circuit 82, and the connection point 83*a* of the capacitor circuit 83 are connected to the input terminal 30*a* via a connection wire L1. Thus, the connection points 81*a*, 82*a*, and 83*a* are electrically connected to the input terminal 30*a*. The connection wire L1 is connected to a connection wire L11 that connects the input terminal 30*a* to a terminal 20*a* of the power source 20.

For example, the connection point 81*b* of the capacitor circuit 81, the connection point 82*b* of the capacitor circuit 82, and the connection point 83*b* of the capacitor circuit 83 are connected to the input terminal 30*b* via a connection wire L2. Thus, the connection points 81*b*, 82*b*, and 83*b* are electrically connected to the input terminal 30*b*. The connection wire L2 is connected to a connection wire L12 that connects the input terminal 30*b* to a terminal 20*b* of the power source 20.

The common mode transformer 61 includes a one-phase primary wound wire 61*t* and three-phase secondary wound wires 61*u*, 61*v*, and 61*w*. The common mode transformer 62 includes a one-phase primary wound wire 62*t* and three-phase secondary wound wires 62*u*, 62*v*, and 62*w*. The common mode transformer 63 includes a one-phase primary wound wire 63*t* and three-phase secondary wound wires 63*u*, 63*v*, and 63*w*.

The primary wound wire 61*t* includes a first end 61*a* (one end) electrically connected to the U-phase output terminal 30*u*, and a second end 61*b* (other end) electrically connected to the middle point 81*c* of the capacitor circuit 81. The first end 61*a* of the primary wound wire 61*t* is, for example, connected between the U-phase output terminal 30*u* and the U-phase secondary wound wire 61*u* of the common mode transformer 61.

The secondary wound wire 62*t* includes a first end 62*a* (one end) electrically connected to the V-phase output terminal 30*v*, and a second end 62*b* (other end) electrically connected to the middle point 82*c* of the capacitor circuit 82. The first end 62*a* of the secondary wound wire 62*t* is, for example, connected between the V-phase output terminal 30*v* and the V-phase secondary wound wire 61*v* of the common mode transformer 61.

The primary wound wire 63*t* includes a first end 63*a* (one end) electrically connected to the W-phase output terminal 30*w*, and a second end 63*b* (other end) electrically connected to the middle point 83*c* of the capacitor circuit 83. The first end 63*a* of the primary wound wire 63*t* is, for example, connected between the W-phase output terminal 30*w* and the W-phase secondary wound wire 61*w* of the common mode transformer 61.

As described above, the first ends 61*a*, 62*a*, and 63*a* of the primary wound wires 61*t*, 62*t*, and 63*t* of the three common mode transformers 61, 62, and 63 are connected to the three output terminals 30*u*, 30*v*, and 30*w* of the inverter 30, respectively. That is, the first 61*a* of the primary wound wire 61*t* of the common mode transformer 61 is connected to the output terminal 30*u* having a U phase of three phases of the inverter 30. The first 62*a* of the primary wound wire 62*t* of the common mode transformer 62 is connected to the output terminal 30*v* having a V phase of three phases of the inverter 30. The first 63*a* of the primary wound wire 63*t* of the common mode transformer 63 is connected to the output terminal 30*w* having a W phase of three phases of the inverter 30. The second ends 61*b*, 62*b*, and 63*b* of the primary wound wires 61*t*, 62*t*, and 63*t* of the three common mode transformers 61, 62, and 63 are connected to the middle points 81*c*, 83*c*, and 85*c* of the capacitor circuits 81, 82, and 83, respectively. The second end 61*b* of the primary wound wire 61*t* is connected between the second end 71*b* of the capacitor 71 and the second end 72*b* of the capacitor 72. The second end 62*b* of the primary wound wire 62*t* is connected between the second end 73*b* of the capacitor 73 and the second end 74*b* of the capacitor 74. The second end 63*b* of the primary wound wire 63*t* is connected between the second end 75*b* of the capacitor 75 and the second end 76*b* of the capacitor 76.

That is, the second end 61*b* of the primary wound wire 61*t* of the common mode transformer 61 connected to the U phase of the inverter 30 is connected to the second end 71*b* of the capacitor 71 whose first end 71*a* is connected to one input terminal 30*b* of the inverter 30 and the second end 72*b* of the capacitor 72 whose first end 72*a* is connected to the other input terminal 30*a* of the inverter 30.

The second end 62*b* of the primary wound wire 62*t* of the common mode transformer 62 connected to the V phase of the inverter 30 is connected to the second end 73*b* of the capacitor 73 whose first end 73*a* is connected to one input terminal 30*b* of the inverter 30 and the second end 74*b* of the capacitor 74 whose first end 74*a* is connected to the other input terminal 30*a* of the inverter 30.

The second end 63*b* of the primary wound wire 63*t* of the common mode transformer 63 connected to the W phase of the inverter 30 is connected to the second end 75*b* of the capacitor 75 whose first end 75*a* is connected to one input terminal 30*b* of the inverter 30 and the second end 76*b* of the capacitor 76 whose first end 76*a* is connected to the other input terminal 30*a* of the inverter 30. The primary wound wires 61*t*, 62*t*, and 63*t* and the capacitors 71, 72, 73, 74, 75, and 76 constitute a filter for detecting common mode voltages of the U phase, the V phase, and the W phase.

The three-phase secondary wound wires 61*u*, 61*v*, 61*w*, 62*u*, 62*v*, 62*w*, 63*u*, 63*v*, and 63*w* of the three common mode transformers 61, 62, and 63 are connected to each other in series. First ends 64*ua*, 64*va*, and 64*wa* of the three-phase secondary wound wires 61*u*, 61*v*, 61*w*, 62*u*, 62*v*, 62*w*, 63*u*, 63*v*, and 63*w* of the three common mode transformers 61, 62, and 63 connected to each other in series are connected to the three output terminals 30u, 30v and 30w of the inverter, respectively.

Second ends 64ub, 64vb, and 64wb of the three-phase secondary wound wires 61u, 61v, 61w, 62u, 62v, 62w, 63u, 63v, and 63w of the three common mode transformers 61, 62, and 63 connected to each other in series are connected to each phase of the three-phase AC electric motor 40 via the motor cable 50.

That is, the first end 64ua of the U-phase secondary wound wires 61u, 62u, and 63u of the common mode transformers 61, 62, and 63 connected to each other in series is connected to the U-phase output terminal 30u of the inverter 30, and the second end 64ub thereof is connected to the U phase of the three-phase AC electric motor 40.

The first end 64va of the V-phase secondary wound wires 61v, 62v, and 63v of the common mode transformers 61, 62, and 63 connected to each other in series is connected to the V-phase output terminal 30v of the inverter 30, and the second end 64vb thereof is connected to the V phase of the three-phase AC electric motor 40.

The first end 64wa of the W-phase secondary wound wires 61w, 62w, and 63w of the common mode transformers 61, 62, and 63 connected to each other in series is connected to the W-phase output terminal 30w of the inverter 30, and the second end 64wb thereof is connected to the W phase of the three-phase AC electric motor 40.

The common mode transformers 61, 62, and 63 are arranged in this order from the output terminals 30u, 30v, and 30w of the inverter 30 toward the three-phase AC electric motor 40. The first ends 64ua, 64va, and 64wa of the secondary wound wires 61u, 61v, and 61w of each phase of the common mode transformer 61 are connected to the output terminals 30u, 30v, and 30w of each phase. The second ends 64ub, 64vb, and 64wb of the secondary wound wires 63u, 63v, and 63w of each phase of the common mode transformer 63 are connected to each phase of the three-phase AC electric motor 40. The secondary wound wires 62u, 62v, and 62w of each phase of the common mode transformer 62 are connected between the secondary wound wires 61u, 61v, and 61w of each phase of the common mode transformer 61 and the secondary wound wires 63u, 63v, and 63w of each phase of the common mode transformer 63.

The U-phase secondary wound wires 61u, 62u, and 63u are connected to each other in series and integrally formed between the U-phase output terminal 30u and the U-phase of the three-phase AC electric motor 40. The V-phase secondary wound wires 61v, 62v, and 63v are connected to each other in series and integrally formed between the V-phase output terminal 30v and the V-phase of the three-phase AC electric motor 40. The W-phase secondary wound wires 61w, 62w and 63w are connected to each other in series and integrally formed between the W-phase output terminal 30w and the W-phase of the three-phase AC electric motor 40. As a result, the secondary wound wires 61u, 61v, and 61w of each phase of the common mode transformer 61, the secondary wound wires 62u, 62v, and 62w of each phase of the common mode transformer 62, and the secondary wound wires 63u, 63v, and 63w of each phase of the common mode transformer 63 are electrically connected to the output terminals 30u, 30v, and 30w of each phase, and are electrically connected to each phase of the three-phase AC electric motor 40.

A ratio of the number of turns of each of the primary wound wires 61t, 62t, and 63t to the number of turns of each of the secondary wound wires 61u, 61v, 61w, 62u, 62v, 62w, 63u, 63v, and 63w of the three common mode transformers 61, 62, and 63 is 3:1. In some examples, the number of turns of each of the primary wound wires 61t, 62t, and 63t of the three common mode transformers 61, 62, and 63 is 3, and the number of turns of each of the secondary wound wires 61u, 61v, 61w, 62u, 62v, 62w, 63u, 63v, and 63w of the three common mode transformers 61, 62, and 63 is 1 (only passing through the inside of a core 65, which will be described later).

Figure 2:
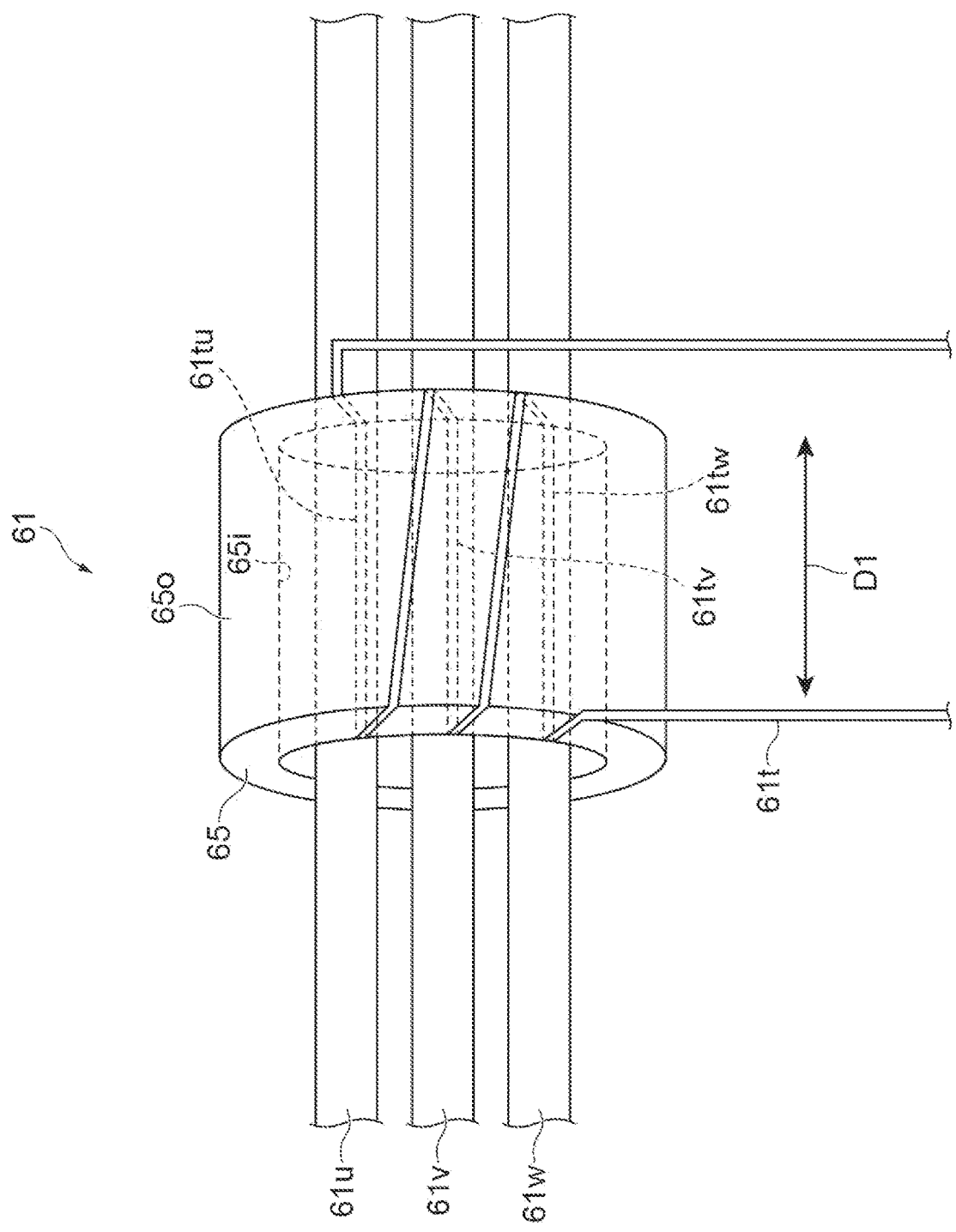
FIG. 2 is a perspective view showing a common mode transformer of FIG. 1.

As shown in FIG. 2, the three common mode transformers 61, 62, and 63 each have an annular core 65. Although FIG. 2 shows the common mode transformer 61 as a representative of the three common mode transformers 61, 62, and 63, the same applies to the other common mode transformers 62 and 63 in the following description.

Each of the primary wound wires 61t, 62t, and 63t of the three common mode transformers 61, 62, and 63 is wound three times by passing through the inside 65i and the outside 65o of an annular core 65 of each of the common mode transformers. Since only about 1 to 2 A of an electric current, for example, flows through the primary wound wires 61t, 62t, and 63t on a side of the capacitors 71, 72, 73, 74, 75, and 76, the conductor cross-sectional area of each of the primary wound wires 61t, 62t, and 63t is very small. As shown in FIG. 2, the cross-sectional areas of the primary wound wires 61t, 62t, and 63t are smaller than the cross-sectional areas of the secondary wound wires 61u, 61v, 61w, 62u, 62v, 62w, 63u, 63v, and 63w. For example, the primary wound wires 61t, 62t, and 63t can be made of copper tape with a thickness of 30 μm or more and 40 μm or less and a width of 2 mm or more and 4 mm or less.

As shown in FIG. 2, the primary wound wire 61t includes three wire portions 61tu, 61tv, and 61tw that pass through the inside 65i of the core 65. The wire portions 61tu, 61tv, and 61tw are arranged spaced along a circumferential direction of the core 65, and extend along an extension direction D1 in which the secondary wound wires 61u, 61v, and 61w extend. The wire portions 61tu, 61tv, and 61tw are disposed to face the secondary wound wires 61u, 61v, and 61w, respectively, in the inside of the core 65.

Each of the secondary wound wires 61u, 61v, 61w, 62u, 62v, 62w, 63u, 63v, and 63w of the three common mode transformers 61, 62, and 63 is wound one time by passing through the inside 65i of the annular core 65 of each of the three common mode transformers 61, 62, and 63 only one time. That is, the U-phase secondary wound wires 61u, 62u, and 63u connected to each other in series and integrated with each other, the V-phase secondary wound wires 61v, 62v, and 63v connected to each other in series and integrated with each other, and the W-phase secondary wound wires 61w, 62w, and 63w connected to each other in series and integrated with each other pass through the inside 65i of the core 65 of each of the three common mode transformers 61, 62, and 63.

The operation and effect of the example common mode filter circuit 10 will be described below. In a first comparative example, in a circuit including a power source, an inverter, and an electric motor, a countermeasure against electromagnetic noise in which a noise filter is installed between the power source and the inverter is envisaged. In this configuration, a common mode electric current is bypassed by the noise filter on the power source side. In this configuration, by confining the common mode electric current between the inverter and the electric motor, the common mode current is prevented from flowing out to the power source side. This configuration can be realized with a common mode inductor and a grounded capacitor (a Y capacitor), which are small.

However, in this configuration, the common mode voltage cannot be attenuated, and the common mode electric current on the electric motor side increases. With such a noise filter on the power source side, it is not possible to reduce radiation noise due to the common mode electric current on the electric motor side and a shaft voltage that causes electrolytic corrosion of bearings of the electric motor. In addition, such a noise filter on the power source side cannot reduce electromagnetic noise intrusion into a control circuit for an electric current sensor, an angle sensor, and an inverter.

On the other hand, in a second comparative example, as in Japanese Unexamined Patent Publication No. 2019-115223, a countermeasure against electromagnetic noise in which a noise filter is installed between the inverter and the electric motor is envisaged. In addition, as such a noise filter on the electric motor side, a configuration for curbing the common mode voltage itself, which is the cause of electromagnetic noise, is also envisaged. In such a configuration, common mode electric currents on both of the power source side and the electric motor side are attenuated. Therefore, in such a configuration, it is possible to reduce the radiation noise due to the common mode electric current on the electric motor side, which is a problem with the noise filter on the power source side and the shaft voltage that causes electrolytic corrosion of bearings of the electric motor.

However, in such a noise filter on the electric motor side, at least several turns is necessary in the common mode inductor or the common mode transformer that constitutes the noise filter. Therefore, the size of the noise filter is increased in a large-current inverter.

In a third comparative example, for example, a configuration in which a differential mode inductor and a common mode inductor are installed between the inverter and the electric motor is envisaged. In this configuration, each of differential mode capacitors is connected to each phase connection to the electric motor, and one end of a filter capacitor, of which the other end is connected to the input terminal of the inverter, is connected to each of the differential mode capacitors. In this configuration, the differential mode inductor and the differential mode capacitor form a sine wave filter. In this configuration, the common mode inductor, the differential mode capacitor, and the filter capacitor constitute a common mode filter. However, the differential mode inductor is very large. Since the common mode inductor also requires several turns, resulting in an increase in size.

In addition, in a fourth comparative example, a configuration in which a small non-zero-phase choke is connected to the output of each phase of the inverter instead of the large differential mode inductor is envisaged. In this configuration, the non-zero-phase choke is connected to the primary wound wire of the common mode transformer, and the output of each phase of the inverter is connected to the secondary wound wire of the common mode transformer. In this configuration, the common mode voltage is detected by the non-zero-phase choke, and the common mode voltage is attenuated by the common mode transformer. However, the common mode transformer requires several turns to secure a magnetizing inductance, resulting in an increase in size.

Therefore, in the first to fourth comparative examples, at least several turns are necessary in the common mode inductor or the common mode transformer. Therefore, the noise filter of the first to fourth comparative examples is not suitable for a large electric current inverter, which has a large conductor cross-sectional area.

On the other hand, in some examples, there is provided the common mode filter circuit 10 which is connected between the inverter 30 having the pair of input terminals 30a and 30b connected to the power source 20 and the three output terminals 30u, 30v, and 30w for outputting a three-phase AC, and the three-phase AC electric motor 40 supplied with the three-phase AC from the output terminals 30u, 30v, and 30w of the inverter 30. The common mode filter circuit 10 includes three common mode transformers 61, 62, and 63 that cancel out common mode voltages of the three-phase AC and three pairs of capacitors 71, 72, 73, 74, 75, and 76 each connected to the common mode transformers 61, 62, and 63 and the input terminals 30a and 30b of the inverter 30.

The first ends 61a, 62a, and 63a of the primary wound wires 61t, 62t, and 63t of the three common mode transformers 61, 62, and 63 are connected to the three output terminals 30u, 30v, and 30w of the inverter 30, respectively.

The second ends 61b, 62b, and 63b of the primary wound wires 61t, 62t, and 63t of the three common mode transformers 61, 62, and 63 are connected to the second ends 71b, 73b, and 75b of the capacitors 71, 73, and 75, respectively. The input terminal 30b of the inverter 30 is connected to the first ends 71a, 73a, and 75a of the capacitors 71, 73, and 75.

In addition, the second ends 61b, 62b, and 63b of the primary wound wires 61t, 62t, and 63t of the three common mode transformers 61, 62, and 63 are connected to the second ends 72b, 74b, and 76b of the other capacitors 72, 74, and 76. The input terminal 30a of the inverter 30 is connected to the first ends 72a, 74a, and 76a of the capacitors 72, 74, and 76. With the above configuration, the common mode voltages are detected by the primary wound wires 61t, 62t, and 63t of the three common mode transformers 61, 62, and 63.

The three-phase secondary wound wires 61u, 61v, 61w, 62u, 62v, 62w, 63u, 63v, and 63w of the three common mode transformers 61, 62, and 63 are connected to each other in series. The first ends 64ua, 64va, and 64wa of the three-phase secondary wound wires 61u, 61v, 61w, 62u, 62v, 62w, 63u, 63v, and 63w of the three common mode transformers 61, 62, and 63 connected to each other in series are connected to the three output terminals 30u, 30v and 30w of the inverter 30, respectively. The second ends 64ub, 64vb, and 64wb of the three-phase secondary wound wires 61u, 61v, 61w, 62u, 62v, 62w, 63u, 63v, and 63w of the three common mode transformers 61, 62, and 63 connected to each other in series are connected to the three-phase AC electric motor 40.

In the three common mode transformers 61, 62, and 63, the primary wound wires 61t, 62t, 63t are for each phase, the secondary wound wires 61u, 61v, 61w, 62u, 62v, 62w, 63u, 63v, and 63w are three phases together, and the ratio of the number of turns of each of the primary wound wires 61t, 62t, and 63t to the number of turns of each of the secondary wound wires 61u, 61v, 61w, 62u, 62v, 62w, 63u, 63v, and 63w is 3:1, and thus the common mode voltages are properly canceled out from the voltage of each phase. As a result, the common mode voltages can be reduced.

The common mode voltages of the respective phases at the output terminals 30u, 30v, and 30w of the inverter 30 are defined as $v_u$, $v_v$, and $v_w$, and the common mode voltages of the respective phases filtered by the common mode filter circuit 10 are defined as $v_u'$, $v_v'$, and $v_w'$. For example, in the U-phase secondary wound wires 61u, 62u, and 63u, the common mode voltages $v_u$, $v_v$, and $v_v$ of the respective phrases are decremented by ⅓ in the three common mode transformers 61, 62, and 63 as in the following expression (1).

$$v_u' = v_u - (1/3)\cdot v_u - (1/3)\cdot v_v - (1/3)\cdot v_w \quad (1)$$

The sum of ⅓ of the common mode voltages $v_u$, $v_v$, and $v_w$ of the respective phases is equal to the common mode voltage $v_{cm}$ of each phase. Therefore, the common mode voltage can be canceled out in the U phase as shown in the following expression (2). The same applies to the V phase and the W phase.

$$v_u' = v_u - (1/3)\cdot v_u - (1/3)\cdot v_v - (1/3)\cdot v_w = v_u - v_{cm} \quad (2)$$

Figure 3A:
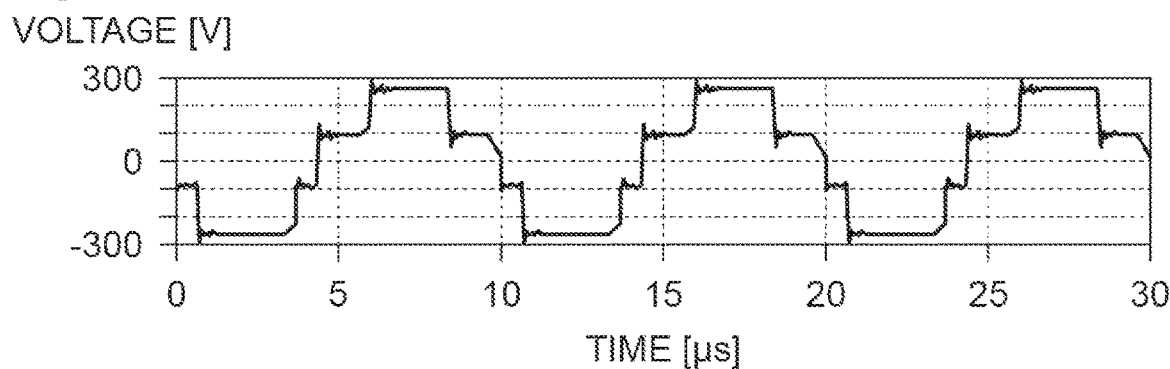
FIG. 3A is a graph showing a one-phase AC voltage supplied from an inverter in a case where there is no common mode filter circuit.
Figure 3B:
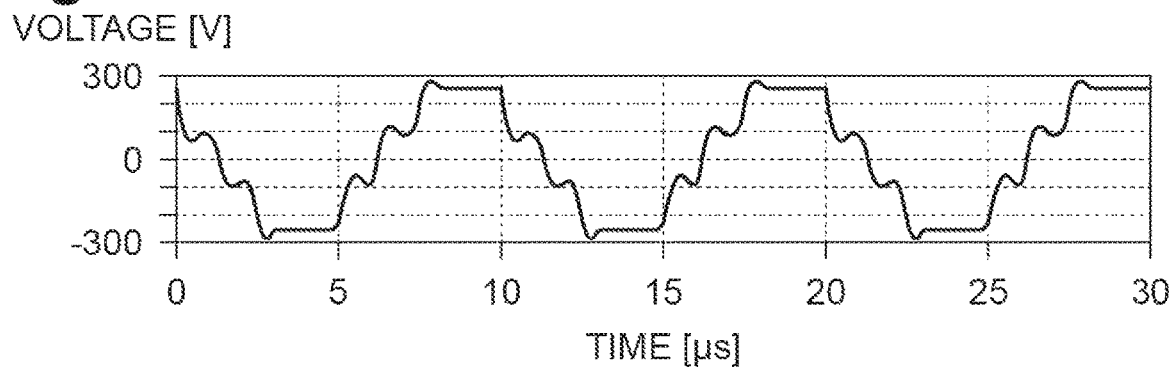
FIG. 3B is a graph showing a one-phase AC voltage supplied from an inverter in a case where a common mode choke coil is installed.
Figure 3C:
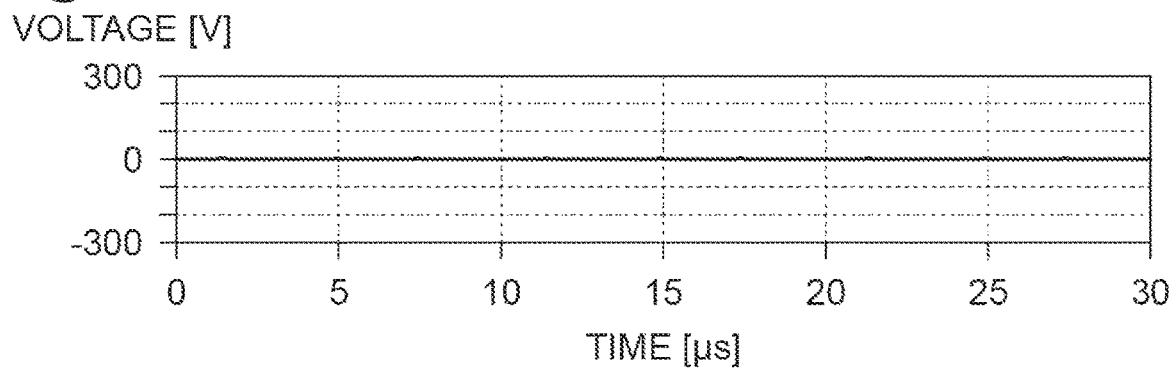
FIG. 3C is a graph showing a common mode voltage in a case where an example common mode filter circuit is installed.
Figure 3D:
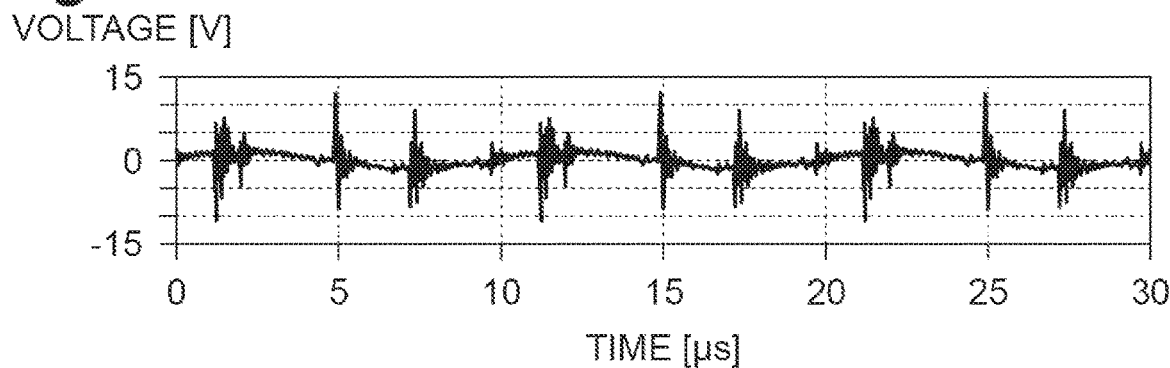
FIG. 3D is a graph showing the common mode voltage in a case where a voltage axis of FIG. 3C is enlarged.

For example, as shown in FIG. 3A, a significant common mode voltage occurs in a case where there is no filter. As shown in FIG. 3B, even in a case where the common mode choke is installed, a high frequency component is attenuated to some extent. On the other hand, as shown in FIG. 3C, in the example common mode filter circuit 10, the common mode voltage is attenuated to appear nearly 0 on the same scale of a voltage axis as the case where there is no filter as in FIG. 3A. As shown in FIG. 3D, in the example common mode filter circuit 10, the common mode voltage can be checked by increasing the scale of the voltage axis to 20 times that of the case where there is no filter as in FIG. 3A. As shown in FIG. 3D, an absolute value of the common mode voltage supplied to the electric motor 40 from the output terminal 30u through the common mode transformer unit 60 is 15 V or less. An absolute value of the common mode voltage supplied to the electric motor 40 from the output terminal 30v through the common mode transformer unit 60 is 15 V or less. An absolute value of the common mode voltage supplied to the electric motor 40 from the output terminal 30w through the common mode transformer unit 60 is 15 V or less.

In addition, in some examples, since the ratio of the number of turns on the primary side to the number of turns on the secondary side is 3:1, the number of turns of each of the thick secondary wound wires 61u, 61v, 61w, 62u, 62v, 62w, 63u, 63v, and 63w can be reduced. Since the electric current flowing through the primary wound wires 61t, 62t, and 63t is small, the primary wound wires 61t, 62t, and 63t can be thin and do not occupy a large space even with a large number of turns. Therefore, it is possible to significantly reduce the size of each of the common mode transformers 61, 62, and 63. That is, in some examples, the magnetizing inductance of the common mode transformers 61, 62, and 63 can be ensured, and the inverter 30 with a large electric current can be handled.

Further, in some examples, the number of turns of each of the primary wound wires 61t, 62t, and 63t of the three common mode transformers 61, 62, and 63 is 3, and the number of turns of each of the secondary wound wires 61u, 61v, 61w, 62u, 62v, 62w, 63u, 63v, and 63w of the three common mode transformers 61, 62, and 63 is 1. Therefore, it is possible to make the number of turns of each of the thick secondary wound wires 61u, 61v, 61w, 62u, 62v, 62w, 63u, 63v, and 63w minimum. Since the electric current flowing through the primary wound wires 61t, 62t, and 63t is small, the primary wound wires 61t, 62t, and 63t can be thin. In addition, since the number of turns of each of the primary wound wires 61t, 62t, and 63t is 3, the primary wound wires 61t, 62t, and 63t occupy only a small space. Therefore, it is possible to significantly reduce the size of each of the common mode transformers 61, 62, and 63.

Further, in some examples, since the electric current flowing through the primary wound wires 61t, 62t, and 63t is small, the primary wound wires 61t, 62t, and 63t can be thin. Since each of the primary wound wires 61t, 62t, and 63t is wound three times by passing through the inside 65i and the outside 65o of the annular core 65 of each of the common mode transformers 61, 62, and 63, the primary wound wires 61t, 62t, and 63t occupy only a small space. In addition, since each of the secondary wound wires 61u, 61v, 61w, 62u, 62v, 62w, 63u, 63v, and 63w of the three common mode transformers 61, 62, and 63 is wound one time by passing through the inside 65i of the annular core 65 of each of the three common mode transformers 61, 62, and 63 only one time, it is easy to increase the space factor of each of the secondary wound wires 61u, 61v, 61w, 62u, 62v, 62w, 63u, 63v, and 63w, and it is easy to reduce the size of each of the three common mode transformers 61, 62, and 63. Therefore, it is possible to significantly reduce the size of each of the common mode transformers 61, 62, and 63.

It is to be understood that not all aspects, advantages and features described herein may necessarily be achieved by, or included in, any one particular example. Indeed, having described and illustrated various examples herein, it should be apparent that other examples may be modified in arrangement and detail. For example, in some examples, the annular core 65 which completely continuously surrounds the secondary wound wires 61u, 61v, 61w, 62u, 62v, 62w, 63u, 63v, and 63w has been disclosed. However, as long as a magnetic circuit is formed by the core 65, the annular core 65 also includes one that is divided at any part and discontinuously surrounds the secondary wound wires 61u, 61v, 61w, 62u, 62v, 62w, 63u, 63v, and 63w.

According to the example common mode filter circuit, it is possible to reduce a common mode voltage.

The invention claimed is:

1. A common mode filter circuit comprising:
   a common mode transformer unit comprising a first common mode transformer, a second common mode transformer and a third common mode transformer, and electrically connected between an electric motor and an inverter comprising a first input terminal, a second input terminal, a first output terminal, a second output terminal and a third output terminal; and
   a capacitor unit comprising a first capacitor circuit, a second capacitor circuit and a third capacitor circuit, and electrically connected between the inverter and the common mode transformer unit,
   wherein each of the first capacitor circuit, the second capacitor circuit and the third capacitor circuit comprises:
      a first connection point electrically connected to the first input terminal of the inverter;
      a second connection point electrically connected to the second input terminal of the inverter;
      a middle point disposed between the first connection point and the second connection point;
      a first capacitor connected between the first connection point and the middle point; and
      a second capacitor connected between the middle point and the second connection point,
   wherein the first common mode transformer comprises:
      a first secondary wound wire, a second secondary wound wire and a third secondary wound wire connected in series to the first output terminal of the inverter, the second output terminal of the inverter and the third output terminal of the inverter, respectively; and
      a primary wound wire electrically connected between the first output terminal of the inverter and the middle point of the first capacitor circuit, wherein the second common mode transformer comprises:
a first secondary wound wire, a second secondary wound wire and a third secondary wound wire connected in series to the first secondary wound wire, the second secondary wound wire and the third secondary wound wire of the first common mode transformer, respectively; and
a primary wound wire electrically connected between the second output terminal of the inverter and the middle point of the second capacitor circuit,
wherein the third common mode transformer comprises:
a first secondary wound wire, a second secondary wound wire and a third secondary wound wire connected in series to the first secondary wound wire, the second secondary wound wire and the third secondary wound wire of the second common mode transformer, respectively, and connected to the electric motor; and
a primary wound wire electrically connected between the third output terminal of the inverter and the middle point of the third capacitor circuit, and
wherein a ratio of a number of turns of the primary wound wire to a number of turns of the first secondary wound wire, a ratio of a number of turns of the primary wound wire to a number of turns of the second secondary wound wire, and a ratio of a number of turns of the primary wound wire to a number of turns of the third secondary wound wire are each 3:1 in each of the first common mode transformer, the second common mode transformer and the third common mode transformer.

2. The common mode filter circuit according to claim 1, wherein the number of turns of the primary wound wire is 3, and the number of turns of each of the first secondary wound wire, the second secondary wound wire and the third secondary wound wire is 1 in each of the first common mode transformer, the second common mode transformer and the third common mode transformer.

3. The common mode filter circuit according to claim 2, wherein each of the first common mode transformer, the second common mode transformer, and the third common mode transformer comprises an annular core, and
wherein the primary wound wire is wound three times by passing through an inside and an outside of the core, and each of the first secondary wound wire, the second secondary wound wire and the third secondary wound wire is wound one time by passing through the inside of the core one time in each of the first common mode transformer, the second common mode transformer and the third common mode transformer.

4. The common mode filter circuit according to claim 3, wherein the primary wound wire of each of the first common mode transformer, the second common mode transformer and the third common mode transformer comprise a first wire portion, a second wire portion, and a third wire portion passing through the inside of the core and arranged spaced along a circumferential direction of the core.

5. The common mode filter circuit according to claim 1, wherein the first secondary wound wire of the first common mode transformer, the first secondary wound wire of the second common mode transformer, and the first secondary wound wire of the third common mode transformer are connected to each other in series and integrally formed,
wherein the second secondary wound wire of the first common mode transformer, the second secondary wound wire of the second common mode transformer, and the second secondary wound wire of the third common mode transformer are connected to each other in series and integrally formed, and
wherein the third secondary wound wire of the first common mode transformer, the third secondary wound wire of the second common mode transformer, and the third secondary wound wire of the third common mode transformer are connected to each other in series and integrally formed.

6. The common mode filter circuit according to claim 1, wherein a first end of the primary wound wire of the first common mode transformer is connected between the first secondary wound wire of the first common mode transformer and the first output terminal of the inverter,
wherein a first end of the primary wound wire of the second common mode transformer is connected between the second secondary wound wire of the first common mode transformer and the second output terminal of the inverter, and
wherein a first end of the primary wound wire of the third common mode transformer is connected between the third secondary wound wire of the first common mode transformer and the third output terminal of the inverter.

7. The common mode filter circuit according to claim 6, wherein a second end of the primary wound wire of the first common mode transformer is connected to the middle point of the first capacitor circuit,
wherein a second end of the primary wound wire of the second common mode transformer is connected to the middle point of the second capacitor circuit, and
wherein a second end of the primary wound wire of the third common mode transformer is connected to the middle point of the third capacitor circuit.

8. The common mode filter circuit according to claim 1, wherein the first connection point of each of the first capacitor circuit, the second capacitor circuit and the third capacitor circuit is connected to a first connection wire connected to the first input terminal of the inverter, and
wherein the second connection point of each of the first capacitor circuit, the second capacitor circuit and the third capacitor circuit is connected to a second connection wire connected to the second input terminal of the inverter.

9. The common mode filter circuit according to claim 8, wherein the first connection wire is connected to a first connection wire between the first input terminal of the inverter and a first terminal of a power source, and
wherein the second connection wire is connected to second connection wire between the second input terminal of the inverter and a second terminal of the power source.

10. The common mode filter circuit according to claim 1, wherein a cross-sectional area of the first secondary wound wire, a cross-sectional area of the second secondary wound wire and a cross-sectional area of the third secondary wound wire are each greater than a cross-sectional area of the primary wound wire in each of the first common mode transformer, the second common mode transformer, and the third common mode transformer.

11. The common mode filter circuit according to claim 1, wherein the primary wound wire of each of the first common mode transformer, the second common mode transformer and the third common mode transformer is a copper tape having a thickness of 30 µm or more and 40 µm or less and a width of 2 mm or more and 4 mm or less.

12. The common mode filter circuit according to claim 1, wherein an electric current of 1 A or more and 2 A or less is supplied to the primary wound wire of each of the first common mode transformer, the second common mode transformer and the third common mode transformer.

13. The common mode filter circuit according to claim 1, wherein an AC voltage output from each of the first output terminal, the second output terminal and the third output terminal is supplied to the common mode transformer unit.

14. The common mode filter circuit according to claim 13, wherein the primary wound wire of each of the first common mode transformer, the second common mode transformer and the third common mode transformer, and the first capacitor and the second capacitor of each of the first capacitor circuit, the second capacitor circuit and the third capacitor circuit form a filter capable of detecting a common mode voltage of the AC voltage.

15. The common mode filter circuit according to claim 14, wherein the first common mode transformer, the second common mode transformer and the third common mode transformer are configured to cancel out the common mode voltage of the AC voltage.

16. The common mode filter circuit according to claim 15, wherein an absolute value of the common mode voltage of the AC voltage supplied to the electric motor from the first output terminal of the inverter through the common mode transformer unit, an absolute value of the common mode voltage of the AC voltage supplied to the electric motor from the second output terminal of the inverter through the common mode transformer unit, and an absolute value of the common mode voltage of the AC voltage supplied to the electric motor from the third output terminal of the inverter through the common mode transformer unit are each 15 V or less.

17. A drive device comprising:
an electric motor;
an inverter comprising a first input terminal, a second input terminal, a first output terminal, a second output terminal, and a third output terminal; and
a common mode filter circuit electrically connected between the electric motor and the inverter,
wherein the common mode filter circuit comprises:
  a common mode transformer unit comprising a first common mode transformer, a second common mode transformer and a third common mode transformer, and electrically connected between the inverter and the electric motor; and
  a capacitor unit comprising a first capacitor circuit, a second capacitor circuit and a third capacitor circuit, and electrically connected between the inverter and the common mode transformer unit,
wherein each of the first capacitor circuit, the second capacitor circuit and the third capacitor circuit comprises:
  a first connection point electrically connected to the first input terminal of the inverter;
  a second connection point electrically connected to the second input terminal of the inverter;
  a middle point disposed between the first connection point and the second connection point;
  a first capacitor connected between the first connection point and the middle point; and
  a second capacitor connected between the middle point and the second connection point,
wherein the first common mode transformer comprises:
  a first secondary wound wire, a second secondary wound wire and a third secondary wound wire connected in series to the first output terminal of the inverter, the second output terminal of the inverter, and the third output terminal of the inverter, respectively; and
  a primary wound wire electrically connected between the first output terminal of the inverter and the middle point of the first capacitor circuit,
wherein the second common mode transformer comprises:
  a first secondary wound wire, a second secondary wound wire and a third secondary wound wire connected in series to the first secondary wound wire, the second secondary wound wire and the third secondary wound wire of the first common mode transformer, respectively; and
  a primary wound wire electrically connected between the second output terminal of the inverter and the middle point of the second capacitor circuit,
wherein the third common mode transformer comprises:
  a first secondary wound wire, a second secondary wound wire and a third secondary wound wire connected in series to the first secondary wound wire, the second secondary wound wire and the third secondary wound wire of the second common mode transformer, respectively, and connected to the electric motor; and
  a primary wound wire electrically connected between the third output terminal of the inverter and the middle point of the third capacitor circuit, and
wherein a ratio of a number of turns of the primary wound wire to a number of turns of the first secondary wound wire, a ratio of a number of turns of the primary wound wire to a number of turns of the second secondary wound wire, and a ratio of a number of turns of the primary wound wire to a number of turns of the third secondary wound wire are each 3:1 in each of the first common mode transformer, the second common mode transformer and the third common mode transformer.

18. The drive device according to claim 17, wherein the number of turns of the primary wound wire is 3, and the number of turns of each of the first secondary wound wire, the second secondary wound wire and the third secondary wound wire is 1 in each of the first common mode transformer, the second common mode transformer and the third common mode transformer.

19. The drive device according to claim 18,
wherein each of the first common mode transformer, the second common mode transformer, and the third common mode transformer comprises an annular core, and
wherein the primary wound wire is wound three times by passing through an inside and an outside of the core, and each of the first secondary wound wire, the second secondary wound wire and the third secondary wound wire is wound one time by passing through the inside of the core one time in each of the first common mode transformer, the second common mode transformer and the third common mode transformer.

20. The drive device according to claim 17,
wherein the first connection point of each of the first capacitor circuit, the second capacitor circuit and the third capacitor circuit is connected to a first connection wire connected to the first input terminal of the inverter, and wherein the second connection point of each of the first capacitor circuit, the second capacitor circuit and the third capacitor circuit is connected to a second connection wire connected to the second input terminal of the inverter.

* * * * *